(12) United States Patent
Irie

(10) Patent No.: US 6,534,386 B2
(45) Date of Patent: Mar. 18, 2003

(54) METHOD OF MANUFACTURING SEMICONDUCTOR CHIPS

(75) Inventor: Masaaki Irie, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/987,253

(22) Filed: Nov. 14, 2001

(65) Prior Publication Data

US 2002/0197770 A1 Dec. 26, 2002

(30) Foreign Application Priority Data

Jun. 26, 2001 (JP) ........................................ 2001-192861

(51) Int. Cl.⁷ ............................................. H01L 21/301
(52) U.S. Cl. ........................................ 438/464; 438/465
(58) Field of Search ................................. 438/114, 106, 438/113, 458, 462, 464, 465, 668, 15, 124, 126, 127; 257/701, 787, 788, 789, 794, 795

(56) References Cited

U.S. PATENT DOCUMENTS 5,882,956 A * 3/1999 Umehara et al. ............ 438/114

2001/0018229 A1 * 8/2001 Kato et al. .................... 438/106
2002/0014661 A1 * 2/2002 Okamoto et al. ............ 257/347

FOREIGN PATENT DOCUMENTS

| JP | 11-121507 | 4/1999 |
| JP | 2000-21906 | 1/2000 |

* cited by examiner

Primary Examiner—Olik Chaudhuri
Assistant Examiner—Julio J. Maldonado
(74) Attorney, Agent, or Firm—Leydig, Voit & Mayer, Ltd.

(57) ABSTRACT

A method of manufacturing semiconductor chips includes adhering a sheet that is to be tensioned to a reverse side of a semiconductor wafer on a front side of which an integrated circuit has been formed; separating individual semiconductor chips from the semiconductor wafer by dicing the semiconductor wafer from the front side along dicing lines; applying a sealing resin layer of an uncured sealing resin on upper surfaces of the semiconductor chips and in gaps between adjacent semiconductor chips, with the individual semiconductor chips joined by the sheet, thereby sealing the semiconductor chips; and tensioning the sheet, thereby dividing the uncured sealing resin layer into separate pieces along the dicing lines.

10 Claims, 6 Drawing Sheets

METHOD OF MANUFACTURING SEMICONDUCTOR CHIPS

FIELD OF THE INVENTION

The present invention relates a method of manufacturing semiconductor chips by which reliable semiconductor chips can be manufactured easily, at a low cost, and with a high chip yield.

BACKGROUND OF THE INVENTION

In order to advance the ability to make portable electronic equipment, such as digital video cameras, digital cellular telephones, notebook personal computers, and the like, more compact, thinner, and lighter, an important aspect is to improve the surface packaging density of electronic parts within the equipment. For the packaging of semiconductor chips which are one type of electronic part, various SOPs (Small Outline Packages), whose outer configuration dimensions are close to the dimensions of a chip main body due to contrivances made with respect to the internal structure of the package, have been proposed.

One example of a conventional method of manufacturing such a SOP will be described with reference to FIG. 7A to FIG. 7D. First, a semiconductor wafer 101, for which all of the integrated circuit forming processes have been completed, is adhered onto a scribe sheet 201 (see FIG. 7A) Next, from the electrode surface side of the semiconductor wafer, by using a dicing saw 301, the semiconductor wafer is cut along dicing lines 102 into individual semiconductor chips 101a (see FIG. 7B).

After the cutting of the semiconductor wafer along the dicing lines 102 into the individual semiconductor chips 101a is finished, with the semiconductor chips 101a still adhered on the scribe sheet 201, the upper surfaces of the semiconductor chips 101a and the gaps between adjacent semiconductor chips 101a are sealed by a sealing resin 104 (see FIG. 7C).

After the sealing resin 104 has been cured, a second dicing is carried out along the previous dicing lines, but at a width B which is narrower than the previous dicing width A. The semiconductor chips 101a, which are made integral through the sealing resin 104, are cut into the individual semiconductor chips 101a (see FIG. 7D).

However, in the above-described method, because a total of two dicings are required at the time of semiconductor wafer separation and sealing resin separation, a problem arises in that the manufacturing cost is high. Further, after dicing the wafer, in order to carry out the second dicing at the width B which is narrower than the wafer dicing width A, the dicing width A for the time of wafer dicing must be made large. A problem arises in that the effective number of chips which can be obtained from one semiconductor wafer is low, and the chip yield is low.

Furthermore, because dicing is carried out after resin sealing, when the entire surface is merely covered by the sealing resin, the positions of the dicing lines are unclear, the dicing lines cannot be directly confirmed, and it is difficult to improve the precision of dicing. Thus, a transparent resin must be used as the sealing resin, or marks must be provided in advance on extensions of the dicing lines.

Moreover, in the technique for carrying out dicing after resin sealing, at the time of dicing the sealing resin, the interface between the sealing resin and the semiconductor chip separates, and a problem arises in that the reliability of the semiconductor chip deteriorates.

SUMMARY OF THE INVENTION

It is an object of the present invention to provide a method of manufacturing semiconductor chips in which, by a single dicing, reliable semiconductor chips can be manufactured easily and at low cost and at a high chip yield.

The method of manufacturing semiconductor chips according to one aspect of the invention comprises the steps of: adhering a sheet that is to be drawn to a reverse side of a semiconductor wafer on which an integrated circuit has been formed; separating individual semiconductor chips from the semiconductor wafer by dicing the semiconductor wafer from a front side along dicing lines; providing a sealing resin layer formed from an uncured sealing resin on upper surfaces of the semiconductor chips and in gaps between adjacent semiconductor chips, with the individual semiconductor chips maintained in a collected state, thereby sealing the semiconductor chips; and drawing the sheet, thereby separating the uncured sealing resin along the dicing lines.

According to the above-mentioned aspect, at the time when the resin filled on the diced semiconductor chips is in an uncured state, the sheet is drawn in a two dimensional plane with the semiconductor chips adhered on the sheet. In this way, the gaps between the semiconductor chips widen, and the sealing resin, which is filled into the gaps between the semiconductor chips and which is in an uncured state, is cut. The semiconductor chips, which were integral through the sealing resin, are separated into individual semiconductor chips.

The method of manufacturing semiconductor chips according to another aspect of the invention comprises the steps of: adhering a sheet that is to be drawn to a reverse side of a semiconductor wafer on which an integrated circuit has been formed; separating individual semiconductor chips from the semiconductor wafer by dicing the semiconductor wafer from a front side along dicing lines; providing a sealing resin layer formed from an uncured sealing resin on upper surfaces of the semiconductor chips and in gaps between adjacent semiconductor chips, with the individual semiconductor chips maintained in a collected state, thereby sealing the semiconductor chips transforming the uncured sealing resin into a semi-cured state; and drawing the sheet, thereby separating the sealing resin in the semi-cured state along the dicing lines.

According to the above-mentioned aspect, at the time when the resin filled on the diced semiconductor chips is in a semi-cured state after a preliminary curing, the sheet is drawn in a two dimensional plane with the semiconductor chips adhered on the sheet. In this way, the gaps between the semiconductor chips widen, and the sealing resin, which is filled into the gaps between the semiconductor chips and which is in a semi-cured state, is cut. The semiconductor chips, which were integral through the sealing resin, are separated into individual semiconductor chips.

Other objects and features of this invention will become apparent from the following description with reference to the accompanying drawings.

DESCRIPTION OF THE PREFERRED EMBODIMENTS

Embodiments of the method of manufacturing semiconductor chips relating to the present invention will be described in detail with reference to the accompanying drawings.

FIG. 1A to FIG. 1F are sectional views for explaining the method of manufacturing semiconductor chips according to the first embodiment of the present invention.

Figure 1A:
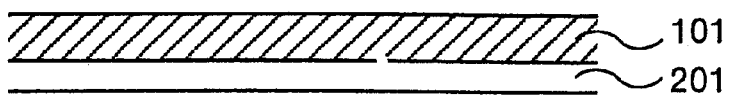
FIG. 1A to FIG. 1F are sectional views for explaining the method of manufacturing semiconductor chips according to a first embodiment of the present invention.
Figure 1B:
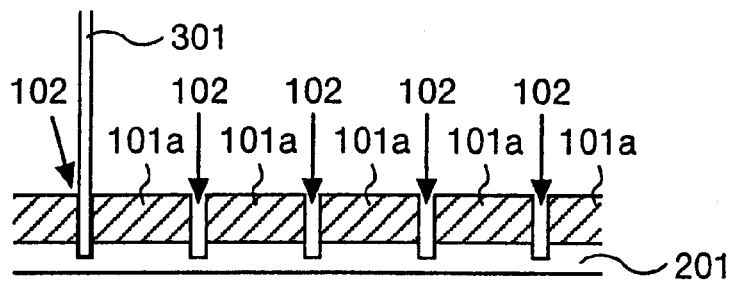
Figure 1C:
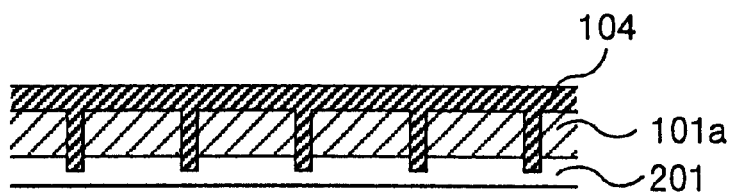
Figure 1D:
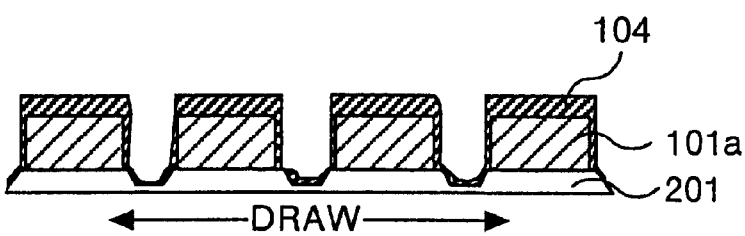
Figure 2:
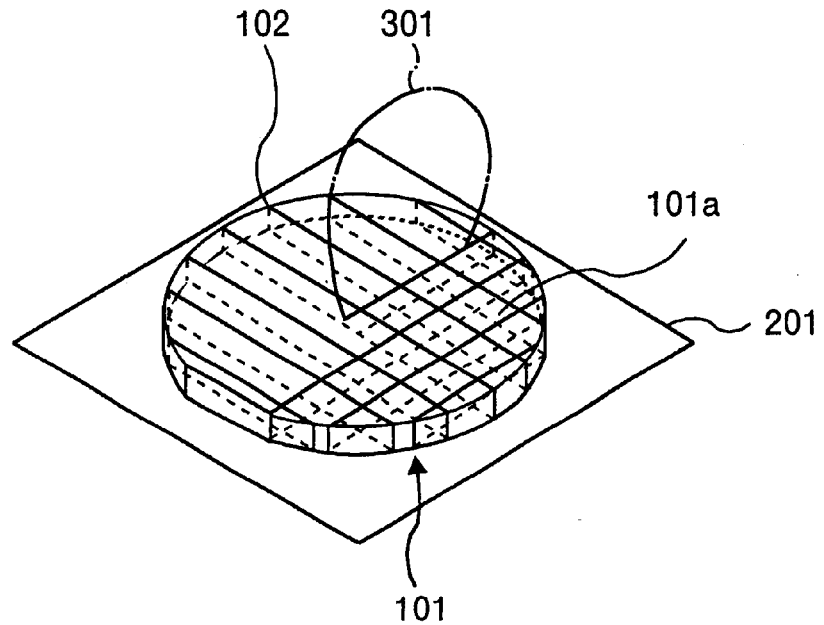
FIG. 2 is a schematic perspective view showing a process of dicing a semiconductor wafer adhered on a scribe sheet.

The scribe sheet 201, which is for assisting in wafer division and which is made from a synthetic resin which has an extensibility, is adhered to the reverse surface of the semiconductor wafer 101 at which all integrated circuit forming processes have been completed (see FIG. 1A). Next, from the electrode surface side of the semiconductor wafer 101, by using the dicing saw 301, the semiconductor wafer 101 is cut along the dicing lines 102 into the individual semiconductor chips 101a (see FIG. 1B). FIG. 2 is a perspective view of the entire semiconductor wafer at the time of the semiconductor wafer cutting process.

After the cutting of the semiconductor wafer along the dicing lines 102 into the individual semiconductor chips 101a is finished, with the semiconductor chips 101a still adhered on the scribe sheet 201, the uncured sealing resin 104 is applied. Namely, by applying the sealing resin 104, while the state in which the individual semiconductor chips are collected together is maintained by the scribe sheet 201, the sealing resin layer 104 is formed on the upper surfaces of the semiconductor chips 101a and in the gaps between adjacent semiconductor chips 101a (see FIG. 1C).

A thermosetting resin, a UV-setting resin or the like, which are generally used as sealing materials for semiconductor chips, can be used, without any particular limitation, as the sealing resin 104. As needed, by a curing method such as heating, ultraviolet irradiation, or the like which corresponds to the type of the sealing resin 104, the uncured sealing resin 104 is set in a semi-cured state (see FIG. 1D) Here, the semi-cured state may be a hardness of a degree such that, when the scribe sheet 201 is drawn in a later process, the sealing resin 104 does not peel off from the semiconductor chips 101a and cracks do not form in the sealing resin 104.

Figure 3:
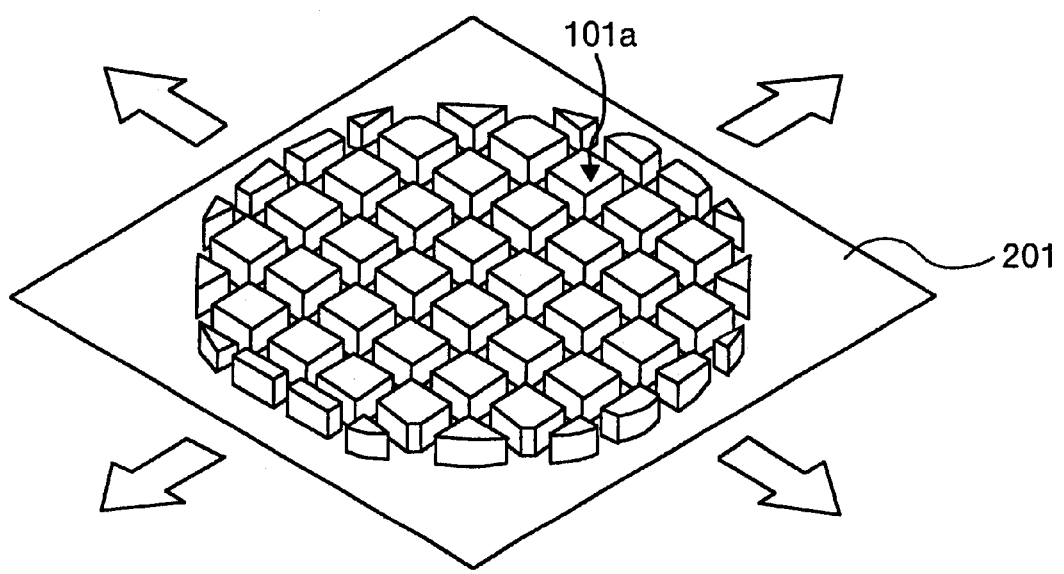
FIG. 3 is a schematic perspective view showing a state in which a scribe sheet is drawn.

With the semiconductor chips 101a adhered on the scribe sheet 201, the scribe sheet 201 is drawn in a two dimensional plane. FIG. 3 is a perspective view of the entire semiconductor wafer at the time of drawing the scribe sheet. By drawing the scribe sheet 201, the gaps between the semiconductor chips 101a are widened, and the sealing resin 104 filled into the gaps between the semiconductor chips 101a is cut. The semiconductor chips 101a, which were integral through the sealing resin 104, are separated into the individual semiconductor chips 101a (see FIG. 1E).

Figure 1E:
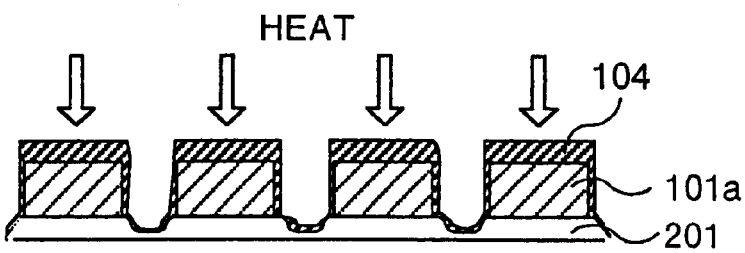
Figure 1F:
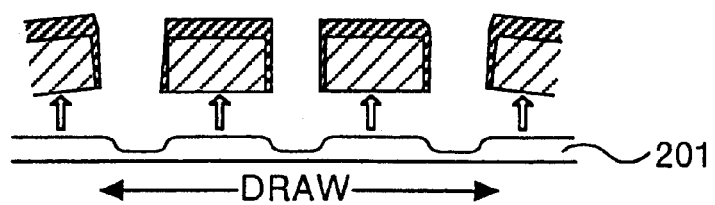

By setting the semi-cured sealing resin 104 in a cured state by applying a curing method such as heating, ultraviolet irradiation, or the like which corresponds to the type of the sealing resin 104, the semiconductor chips are completed (see FIG. 1E). Due to the scribe sheet 201 being drawn even further, the completed semiconductor chips can be easily peeled off from the scribe sheet 201 (see FIG. 1F)

In this way, according to the first embodiment, the semiconductor chips are separated into the individual semiconductor chips due to the sealing resin being filled on the individually separated semiconductor chips and the scribe sheet 201 being drawn when the sealing resin is in a semi-cured state. Thus, even if dicing is not carried out again after dicing the semiconductor wafer, the semiconductor chips can easily be separated into the individual semiconductor chips, and therefore, costs accompanying dicing can be decreased. Further, because there is no need to set the dicing width wide, the chip yield can be increased. Moreover, because there is no cutting in the state in which the semiconductor chips and the sealing resin are joined together, the risks of the sealing resin being peeled off from the semiconductor chips and the sealing resin cracking can be kept to a minimum.

The second embodiment of the present invention will now be described. In the first embodiment, after dicing the semiconductor wafer and sealing the chips, in that state, the scribe sheet 201 is drawn and the semiconductor chips are separated into the individual semiconductor chips 101a. However, the second embodiment is characterized in that, after sealing the chips, grooves are formed in advance along dicing lines in the surface of the sealing resin before the semiconductor chips are separated.

FIG. 4A to FIG. 4E are sectional views for explaining the method of manufacturing semiconductor chips according to a second embodiment of the present invention. Numerals which are the same as those of the first embodiment denote the same structures. Note that, here, the processes after the sealing resin layer 104 is formed on the semiconductor chips will be described, and the processes up until before formation of the sealing resin layer 104 are omitted.

Figure 4A:
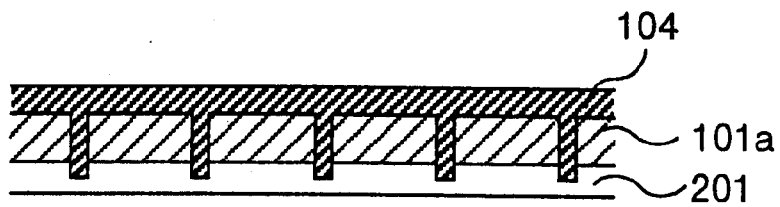
FIG. 4A to FIG. 4E are sectional views for explaining the method of manufacturing semiconductor chips according to a second embodiment of the present invention.
Figure 4B:
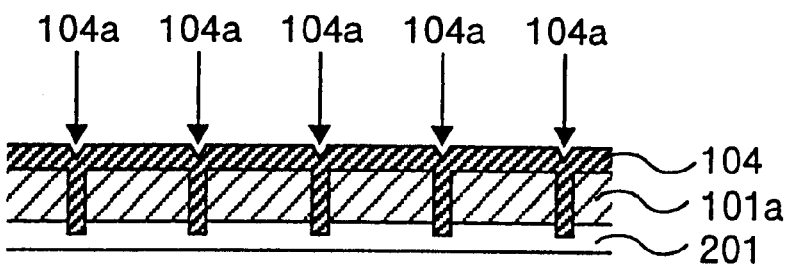
Figure 4C:
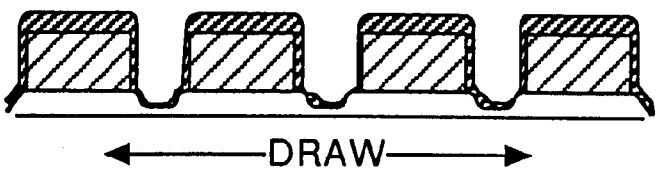

After the sealing resin layer 104 is formed (see FIG. 4A) by applying the uncured sealing resin 104 with the semiconductor chips 101a adhered on the scribe sheet 201, grooves 104a along the dicing lines are formed by a tooling process or the like in the upper surface of the sealing resin layer 104 (see FIG. 4B). Further, as needed, before forming the grooves, it is possible to carry out preliminary curing of the sealing resin layer 104 such that the sealing resin layer 104 is set in a semi-cured state.

With the semiconductor chips 101a adhered on the scribe sheet 201, the scribe sheet 201 is drawn in a two dimensional plane. Due to the scribe sheet 201 being drawn, the gaps between the semiconductor chips 101a widen, and the sealing resin 104 filled into the gaps between the semiconductor chips 101a is cut. The semiconductor chips 101a, which were integral through the sealing resin 104, are separated into the individual semiconductor chips 101a (see FIG. 4C). Here, because the grooves 104a are formed along the dicing lines in the upper surface of the sealing resin layer 104, the semiconductor chips 101a, which are made integral through the sealing resin, are easily separated along the dicing lines.

Figure 4D:
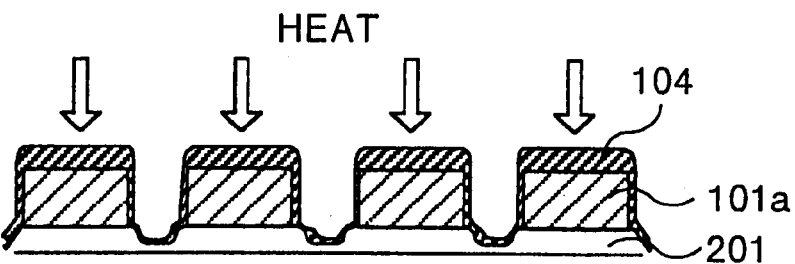
Figure 4E:
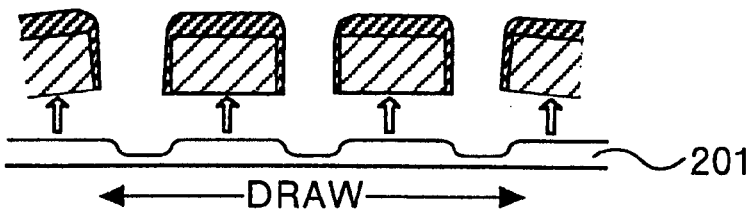

Due to the uncured or semi-cured sealing resin 104 being set in a cured state by applying a curing method such as heating, ultraviolet irradiation, or the like which corresponds to the type of the sealing resin 104, the semiconductor chips are completed (see FIG. 4D). Due to the scribe sheet 201 being drawn further, the completed semiconductor chips can be easily peeled off from the scribe sheet 201 (see FIG. 4E). Note that the method of leading the electrodes to the exterior can be carried out by grinding or polishing of the electrode surface of the semiconductor.

In this way, in the second embodiment, because grooves along the dicing lines are formed in the upper surface of the sealing resin layer 104, the semiconductor chips 101a, which are made integral through the sealing resin, are easily separated along the dicing lines when the scribe sheet is drawn. Accordingly, the separated configurations of the semiconductor chips 101a can be stabilized more. Further, the risks of the sealing resin peeling off from the semiconductor chips and the sealing resin cracking can be decreased even more.

The third embodiment of the present invention will now be described. The third embodiment is characterized in that an anisotropic conductive resin, in which conducive particles are dispersed in an insulating resin, is used as the sealing resin. By using such an anisotropic conductive resin and by compression molding semiconductor chips on whose surfaces bumps are formed in advance, electrode molding can be realized easily.

FIG. 5A to FIG. 5E are sectional views for explaining the method of manufacturing semiconductor chips according to a third embodiment of the present invention.

Figure 5A:
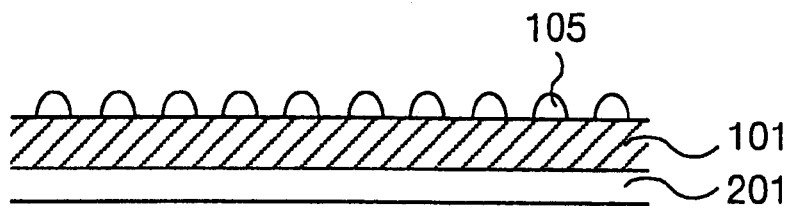
FIG. 5A to FIG. 5E are sectional views for explaining the method of manufacturing semiconductor chips according to a third embodiment of the present invention.

The semiconductor wafer 101, for which all of the integrated circuit forming processes have been completed, is adhered onto the scribe sheet 201 which is formed from a synthetic resin having extensibility (see FIG. 5A). In the third embodiment, bumps 105 are formed on a bonding pad (not illustrated) which is formed on the upper surface of the semiconductor wafer 101 at which an IC has been formed in advance.

Figure 5B:
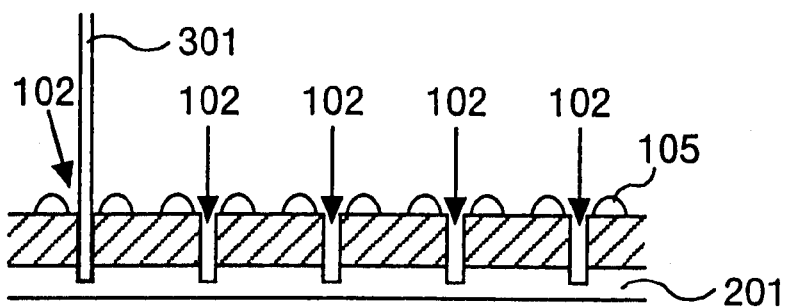

From the electrode surface side of the semiconductor wafer, the semiconductor wafer is cut into the individual semiconductor chips 101a along the dicing lines 102 by the dicing saw 301 (see FIG. 5B).

Figure 5C:
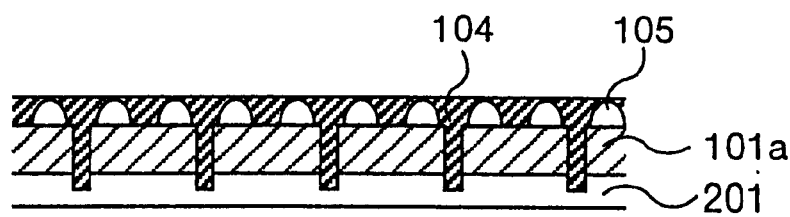

After the cutting of the semiconductor wafer into the individual semiconductor chips 101a along the dicing lines 102 is completed, with the semiconductor chips 101a adhered on the scribe sheet 201, the uncured sealing resin 104 is applied (see FIG. 5C). At the time the sealing resin is applied onto the semiconductor chips 101a, the height of the sealing resin layer 104 is slightly higher than the height of the bumps 105.

Figure 6:
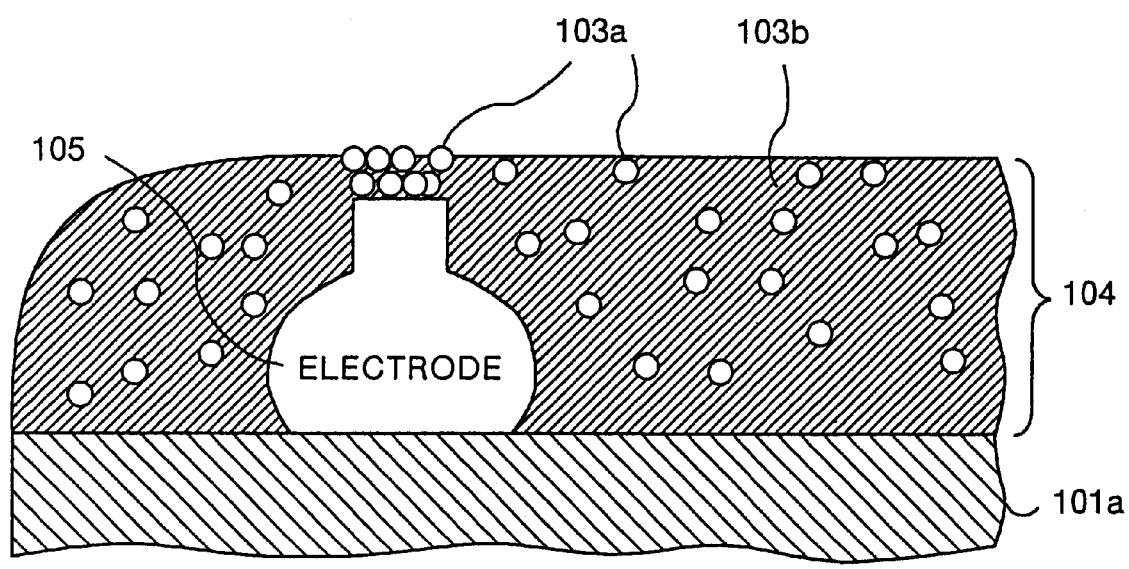
FIG. 6 is an enlarged sectional view showing a peripheral section of a bump of a semiconductor chip manufactured by the third embodiment of the present invention.
Figure 7A:
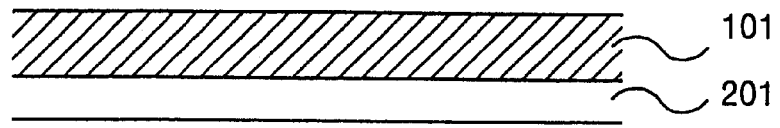
FIG. 7A to FIG. 7D are sectional views for explaining the method of manufacturing semiconductor chips according to a conventional technique.
Figure 7B:
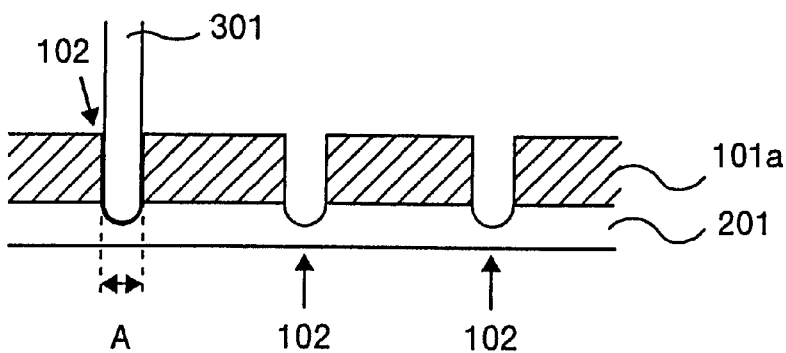
Figure 7C:
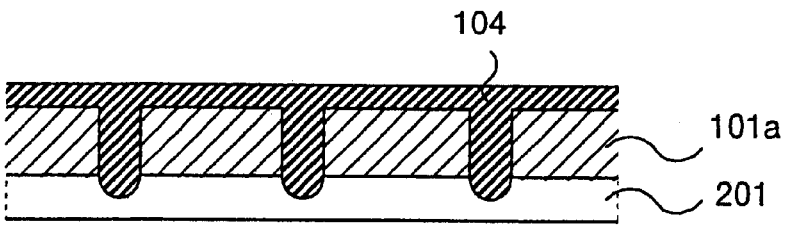
Figure 7D:
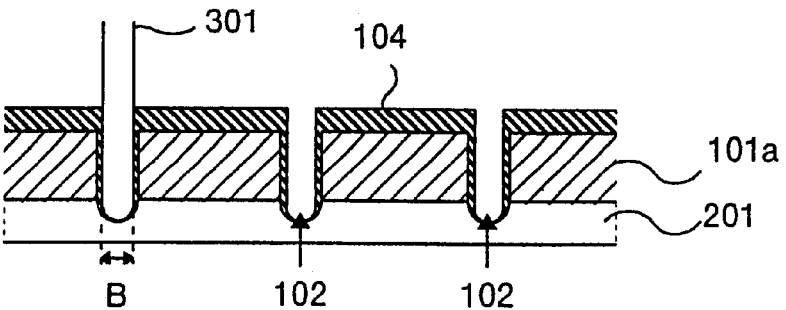

As shown in FIG. 6, an anisotropic conductive resin, in which minute conductive particles 103a are dispersed in an insulating resin 103b, is used as the sealing resin 104. Here, a thermosetting resin, UV-setting resin, or the like may be used, without any particular limitations, as the insulating resin 103b. However, a thermosetting resin is preferably used, and in particular, a thermosetting epoxy resin is preferably used.

Examples of the conductive particles 103a which are dispersed in the insulating resin 103b are resin particles which are gold plated, nickel particles, nickel particles which are gold plated, silver particles which are coated with an insulating resin, and the like, and there are various particle diameters. By applying pressure, or pressure and temperature, to the anisotropic conductive resin, simultaneously with the adhesion, an electrically connected state in the longitudinal direction and an insulated state in the transverse direction can be obtained via the conductive particles 103a which are disposed between electrodes.

Figure 5D:
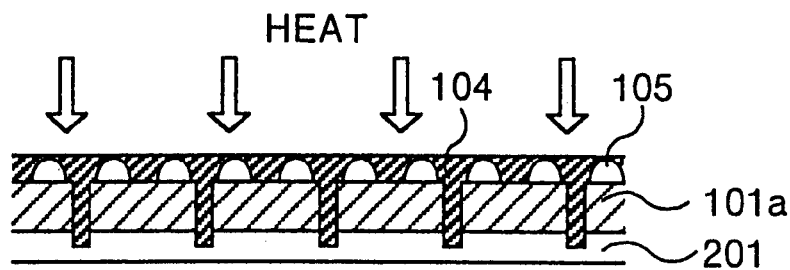
Figure 5E:
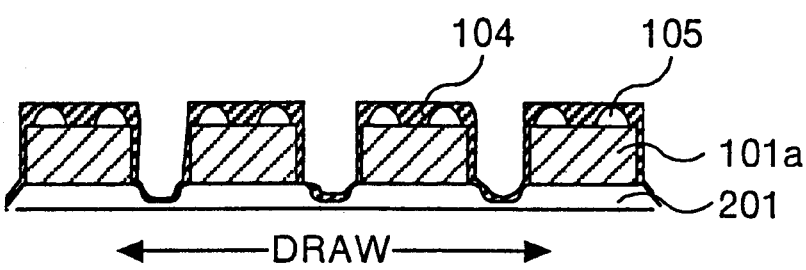

As needed, by a curing method such as heating, ultraviolet irradiation, or the like which corresponds to the type of the sealing resin 104, the uncured sealing resin 104 is set in a semi-cured state (see FIG. 5D).

With the semiconductor chips 101a adhered on the scribe sheet 201, the scribe sheet 201 is drawn in a two dimensional plane. Due to the scribe sheet 201 being drawn, the gaps between the semiconductor chips 101a widen, and the sealing resin 104 filled into the gaps between the semiconductor chips 101a is cut. The semiconductor chips 101a, which were integral through the sealing resin 104, are separated into the individual semiconductor chips 101a (see FIG. 5E). Next, due to the uncured or semi-cured sealing resin 104 being set in a cured state by applying a curing method such as heating, ultraviolet irradiation, or the like which corresponds to the type of the sealing resin 104, the semiconductor chips are completed.

Due to the scribe sheet 201 being drawn further, the semiconductor chips 101a are peeled off from the scribe sheet 201. According to the third embodiment, the sealing resin 104 is used. Thus, if the semiconductor chips 101a are peeled off the scribe sheet 201 and the sealing resin 104 (anisotropic conductive resin) after compression molding of the semiconductor chips 101a is cured, the conductive particles 103a are electrically connected to each other at the places of the bumps 105. Thus, the bumps 105 can be made continuous with external wiring. Note that, in a case in which a thermosetting resin is used as the sealing resin, the sealing resin 104 in a semi-cured state may be cured by heating the semiconductor chips at the same time as the compression molding.

In this way, at the time of sealing the semiconductor chips having external connection terminals such as bumps or the like, by using an anisotropic conductive resin as the sealing resin, electrode molding can easily be realized merely by, for example, compression molding the semiconductor chips which have been separated into the individual chips.

As described above, according to one aspect of this invention, when the sealing resin filled onto the diced semiconductor chips is in an uncured state, the sheet is drawn in a two dimensional plane with the semiconductor chips adhered on the sheet. The semiconductor chips, which were integral through the sealing resin, are thereby separated into the individual semiconductor chips. Therefore, the semiconductor chips can be easily separated into the individual semiconductor chips, and costs accompanying dicing can be decreased. Further, because there is no need to set the dicing width to be wide, the chip yield can be increased. Further, because cutting is not carried out in a state in which the semiconductor chips and the sealing resin are joined, the risks that the sealing resin will peel off the semiconductor chips and that cracks will form in the sealing resin can be kept to a minimum.

According to another aspect, when the sealing resin filled onto the diced semiconductor chips is in a semi-cured state, the sheet is drawn in a two dimensional plane with the semiconductor chips adhered on the sheet. The semiconductor chips, which were integral through the sealing resin, are thereby separated into the individual semiconductor chips. Therefore, the semiconductor chips can be easily separated into the individual semiconductor chips, and costs accompanying dicing can be decreased. Further, because there is no need to set the dicing width to be wide, the chip yield can be increased. Further, because cutting is not carried out in a state in which the semiconductor chips and the sealing resin are joined, the risks that the sealing resin will peel off the semiconductor chips and that cracks will form in the sealing resin can be kept to a minimum. Moreover, grooves are formed in the surface of the sealing resin along the dicing lines before the sheet is drawn and the individual semiconductor chips are separated. Thus, the semiconductor chips are easily cut along the dicing lines when the sheet is drawn. Further, the resin configurations at the time of separating the semiconductor chips into the individual semiconductor chips can be stabilized more.

Furthermore, an anisotropic conductive resin, in which conductive particles are dispersed in an insulating resin, is used as the sealing resin. Therefore, there is the effect that electrode molding can be easily realized.

Moreover, due to semiconductor chips, on whose surfaces external connection terminals are provided in advance, being compression molded, there is the effect that the external connection terminals of the semiconductor chips can be made continuous with external wiring through the anisotropic conductive resin.

Furthermore, bumps are formed as the external connection terminals. Thus, there is the effect that, if the semiconductor chips are compression molded, the bumps can be easily made continuous with the external wiring through the anisotropic conductive resin.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing semiconductor chips comprising:

forming an integrated circuit on a front side of a semiconductor wafer;

adhering a sheet that is to be tensioned to a reverse side of the semiconductor wafer;

separating individual semiconductor chips from the semiconductor wafer by dicing the semiconductor wafer from the front side along dicing lines;

applying a sealing resin layer of an uncured sealing resin on the semiconductor chips and in gaps between adjacent semiconductor chips, with the individual semiconductor chips joined by the sheet, thereby sealing the semiconductor chips; and tensioning the sheet, thereby dividing the uncured sealing resin layer into separate pieces along the dicing lines.

2. The method of manufacturing semiconductor chips according to claim 1, including forming grooves along the dicing lines in a surface of the sealing resin layer before separating individual semiconductor chips.

3. The method of manufacturing semiconductor chips according to claim 1, wherein the sealing resin is an anisotropically conducting resin.

4. The method of manufacturing semiconductor chips according to claim 3, including forming, by compression molding, external connection terminals, before adhering the sheet, on surfaces of the semiconductor chips and that are continuous with external wiring.

5. The method of manufacturing semiconductor chips according to claim 4, wherein the external connection terminals are bumps.

6. A method of manufacturing semiconductor chips comprising:

forming an integrated circuit on a front side of a semiconductor wafer;

adhering a sheet that is to be tensioned to a reverse side of the semiconductor wafer;

separating individual semiconductor chips from the semiconductor wafer by dicing the semiconductor wafer from the front side along dicing lines;

applying a sealing resin layer of an uncured sealing resin on the semiconductor chips and in gaps between adjacent semiconductor chips, with the individual semiconductor chips joined by the sheet, thereby sealing the semiconductor chips;

transforming the uncured sealing resin into a semi-cured state; and tensioning the sheet, thereby separating the sealing resin in the semi-cured state along the dicing lines.

7. The method of manufacturing semiconductor chips according to claim 6, including forming grooves along the dicing lines in a surface of the sealing resin layer before separating individual semiconductor chips.

8. The method of manufacturing semiconductor chips according to claim 6, wherein the sealing resin is an anisotropically conducting resin.

9. The method of manufacturing semiconductor chips according to claim 8, including forming, by compression molding, external connection terminals, before adhering the sheet, on surfaces of the semiconductor chips and that are continuous with external wiring.

10. The method of manufacturing semiconductor chips according to claim 9, wherein the external connection terminals are bumps.

* * * * *